United States Patent [19]

Eden

[11] 4,405,870
[45] Sep. 20, 1983

[54] SCHOTTKY DIODE-DIODE FIELD EFFECT TRANSISTOR LOGIC

[75] Inventor: Richard C. Eden, Thousand Oaks, Calif.

[73] Assignee: Rockwell International Corporation, El Segundo, Calif.

[21] Appl. No.: 214,924

[22] Filed: Dec. 10, 1980

[51] Int. Cl.³ .................. H03K 19/094; H03K 19/12; H03K 19/20; H03K 19/017
[52] U.S. Cl. ................................. 307/446; 307/450; 307/475
[58] Field of Search .............. 307/443, 446, 448, 450, 307/445, 457, 458, 317 A, 475, 442

[56] References Cited

U.S. PATENT DOCUMENTS

| | | | |
|---|---|---|---|
| 3,250,917 | 5/1966 | Hofstein | 307/475 |
| 3,299,291 | 1/1967 | Warner, Jr. et al. | 307/448 |
| 3,363,111 | 1/1968 | Moreines | 307/442 X |
| 3,515,899 | 6/1970 | May | 307/457 |
| 3,969,632 | 7/1976 | Bobenrieth | 307/450 X |
| 4,013,896 | 3/1977 | Picquendar et al. | 307/440 |
| 4,028,556 | 6/1977 | Cachier et al. | 307/450 |
| 4,038,563 | 7/1977 | Zuleeg et al. | 307/450 |
| 4,160,918 | 7/1979 | Nazarian et al. | 307/450 |
| 4,177,390 | 12/1979 | Cappon | 307/450 |

FOREIGN PATENT DOCUMENTS 2230125 12/1974 France .

OTHER PUBLICATIONS

Nuzillat et al., "Low Pinch-Off Voltage FET Logic (l.p.f.l.): L.S.I. Oriented Logic Approach Using Quasi-normally Off MESFETs", *IEEE Proc.*, vol. 127, Pt. 1, No. 5, pp. 287–296, 10/80.
Dreyfack, "Gallium Arsenide to Yield 5-GHz Divider", *Electronics* (pub.); pp. 76 & 78; 10/9/80.
Liechti, "GaAs FET Logic", *Inst. Phys. Conf. Ser. No. 33a (c) 1977; Chapt. 5, Conf. Proc. of the 6th Intl. Symp. on GaAs & Related Compounds; Edinburgh, Scotland;* 20–22, Sep. 1976.
Suzuki et al., "Logic Circuits with 2 μm Gate Schottky Barrier FETs"; Proc. of 6th Conf. on Solid State Devices, Tokyo, Jap., 1974; pp. 219–224.
Eden et al., Low Power Depletion Mode Ion-Implanted GaAs FET Integrated Circuits, IEEE Trans. Elect. Dev., vol. ED-24, p. 1209 (1977).
Eden et al., Low Power GaAs Digital ICs Using Schottky Diode-FET Logic, 1978 IEEE Int. Solid State Circ. Conf., Dig. of Tech. Papers, p. 68 (1978).
Eden et al., The Prospects for Ultrahigh-Speed VLSI GaAs Digital Logic, IEEE Trans. Elec. Dev., vol. ED-26, p. 299 (1979).
Eden et al., Planar GaAs IC Technology: Applications for Digital LSI, IEEE J. Sol. State Cir., vol. SC-13, p. 419 (1978).
Ishikawa et al., Normally-Off Type GaAs MESFET for Low Power, High Speed Logic Circuits, 1977 IEEE Sol. State Circ. Conf., Dig. of Tech. Papers, p. 200, (1977).
Schottky-Diode/FET Logic Bring VLSI into the Real World, Electronic Design, vol. 5, p. 19 (Mar. 1, 1978).
Van Tuyl et al., High-Speed Integrated Logic with GaAs MESFETs, IEEE J. Sol. State Cir., vol. SC-9, p. 269 (1974).
Washburn, An Application of Boolean Algebra to the Design of Electronic Switching Circuits, AIEE Trans. Comm. & Elec., vol. 72, p. 380 (1953).
Zuleeg et al., Femtojoule High-Speed Planar GaAs E-JFET Logic, IEEE Trans. Elec. Dev., vol. ED-25, p. 628 (1978).

*Primary Examiner*—Larry N. Anagnos
*Attorney, Agent, or Firm*—H. Frederick Hamann; Craig O. Malin; John J. Deinken

[57] ABSTRACT

Disclosed is a logic circuit with a plurality of AND logic elements, each including a plurality of Schottky diodes with each cathode connected to a logic input and the anodes connected in common to establish an AND output. A diode pull up FET is provided for each AND output, with the source connected to the AND output, the gate connected to the source, and the drain connected to a source of positive bias potential. An OR logic element includes a plurality of Schottky diodes with each anode connected to one of the AND outputs and the cathodes connected in common to establish an OR output, while a diode pull down FET has its drain connected to the OR output, with the gate connected to the source and the source connected to a source of negative bias potential. A level shifting diode is placed between the OR output and the pull down FET. An output FET is connected through its gate to the drain of the diode pull down FET, with the source connected to ground and the drain providing a logic output from the circuit. An output pull up FET has its source connected to the drain of the output FET, the gate connected to the source, and the drain connected to the source of positive bias potential.

16 Claims, 5 Drawing Figures

SCHOTTKY DIODE-DIODE FIELD EFFECT TRANSISTOR LOGIC

BACKGROUND OF THE INVENTION

This invention relates to the field of solid state electronics and, more particularly, to integrated circuitry for digital logic applications.

The current trend in digital electronics is to incorporate increasingly greater circuit complexity on a single semiconductor circuit chip. Considering the military applications presently under development, for example, the electronics specifications for a variety of missions include a requirement for very large scale integration (VLSI), i.e., greater than 10,000 gates on a single integrated circuit chip. Complexities in the VLSI range, however, impose a number of limitations on chip design.

The principal requirements of a digital integrated circuit technology compatible with ultra-high speed large scale (LSI) and very large scale (VLSI) integration are very high density (i.e., a small amount of chip area for each gate), low gate power dissipation, extremely low dynamic switching energy (normally expressed as the speed-power product $P_D \tau_D$), high speed (a very low signal propagation delay through each gate), and a very high yield for the chosen circuit fabrication process. These requirements arise because large numbers of gates, in the $10^4$ to $10^5$ range, cannot be placed on a reasonably sized chip (approximately 1 square centimeter in area) unless the area of each gate is small, i.e., less than approximately 1000 $\mu m^2$/gate. Moreover, the power consumed by each gate must be well below 1 mW if the total power dissipation for the chip is to remain at a manageable level. The constraint on dynamic switching energy is especially severe for high speed VLSI because the chip power dissipation limit must be maintained at high clocking frequencies. Assuming, for example, a maximum power dissipation of 2 watts for a semiconductor chip containing $10^4$ gates at an average gate clocking frequency of 1 GHz, the maximum allowable gate dynamic switching energy $P_D \tau_D$ is 0.1 pJ.

Historically, the development of monolithic integrated circuit technology has been almost exclusively concerned with devices based on silicon materials. With respect to the overall functional complexity which has been achieved on a silicon chip in medium speed logic, and considering the cost per gate which has been reached for such chips, the improvements which have been attained in silicon integrated circuit (IC) technology have been remarkable. In other areas, however, such as the maximum switching speed of silicon ICs, progress has been more limited. Because of such limitations, an attractive alternative available for developing superior high speed LSI and VLSI circuitry is to replace silicon with another semiconductor having superior electron properties. Gallium arsenide (GaAs), for example, is capable in principle of being fabricated into virtually all the device structures which have been achieved in silicon. GaAs differs from silicon principally in its energy band structure, the structure of gallium arsenide resulting in a high (five times that of silicon) electron mobility. This electron mobility, in conjunction with the availability of a semi-insulating GaAs substrate (which cannot be obtained in silicon technology), provides the basis for the development of GaAs integrated circuits which will operate at significantly higher switching speeds and with much lower dynamic switching energy than conventional, silicon-based devices.

Initial progress in GaAs device research was slow, primarily due to the unavailability of an effective method for controlling the active layers of the devices. More recently, however, GaAs integrated circuit technology has overcome such difficulties and advanced considerably, due in large part to the emergence of a viable ion implantation technology and to the fabrication improvements which have been made in microlithography pattern replication techniques. A high-yield planar fabrication approach has been developed, for example, which capitalizes on the proven uniformity, reproducibility, and low cost of implanting directly into semi-insulating GaAs to form the active layers of a device. Planar circuits have been fabricated by using multiple localized ion implants, thereby permitting the active layers of both Schottky diodes and field effect transistors (FETs) to be individually optimized on the same device. A planar metal semiconductor field effect transistor (MESFET) may be fabricated with two implants—a shallow, lightly doped $n^-$ implant forming the channel region, and a deeper $n^+$ implant forming the source and drain regions. In this manner, self-aligned gates with a length of approximately 1 $\mu m$, requiring approximately 0.75 $\mu m$ alignment accuracy, may be formed and will exhibit excellent device characteristics. A thin dielectric cap, through which the implantations are made, is utilized for most implantation annealing to protect the GaAs surfaces during processing and to passivate the surface.

Inasmuch as GaAs Schottky barrier diodes are among the fastest switching semiconductor devices available and their switching energy (approximately $10^{-15}$ J) and required area (the active area can be as small as 1 $\mu m \times 2$ $\mu m$) are very low, their use as logic elements in GaAs digital ICs is very desirable. A logic circuit approach has been developed utilizing high conductance, low capacity Schottky switching diodes as the primary nonlinear logic elements, with inversion and gain accomplished by GaAs depletion mode Schottky gate MESFETs. This Schottky diode FET logic (SDFL) approach, which is disclosed in detail in U.S. Patent Application Ser. No. 011,266, filed Feb. 12, 1979, and now U.S. Pat. No. 4,300,064, exhibits major savings in chip area as compared to previous approaches in which FETs have been used as the primary logic elements.

The SDFL approach for digital integrated circuits incorporates as its basic structure the single level SDFL NOR gate. This gate uses a group of diodes to provide the positive NOR function and an FET to provide inversion and gain. By means of multi-gate or series FETs, the basic SDFL circuit can be extended to two-level OR/NAND functions or, using "drain-dotting", to OR/NAND/WIRED-AND three-level logic functions. In general, however, the number of terms which can practically be "NANDed" with series FETs in SDFL is limited, due to parasitic gate capacitances and FET "ON" resistances, to two or perhaps three without substantial performance degradation. Somewhat similar restrictions apply to the number of "drain dot" terms (i.e., parallel FETs sharing the same pull up element) before the interconnect and drain capitance parasitics slow circuit speeds. This fan-in restriction impedes the effective implementation of logic functions with these gates, causing penalties both in the number of gates (complexity) and the amount of logic propagation delay (speed) required to achieve a desired function.

Consequently, a need has arisen for an integrated logic circuit which exhibits low power, high speed, and very high functional complexity, such as a general two level gate with essentially unlimited fan-in at both levels of logic. With such a gate, any combinatorial logic function may in principle be implemented with a single gate and one logic propagation delay from the application of the inputs and their complements.

SUMMARY OF THE INVENTION

It is a general objective of this invention to provide a new and improved logic circuit.

The logic circuit of this invention includes a plurality of AND logic elements, each AND element including a plurality of Schottky diodes, with the cathode of each diode connected to a logic input and the anodes connected in common to establish an AND output. A diode pull up is connected to each AND output and to a source of positive bias potential to raise the level of the AND output. An OR logic element, including a plurality of Schottky diodes, is provided with each anode connected to one of the AND outputs and the cathodes connected in common to establish an OR output. A first level shifting element is connected to the OR output, while a diode pull down is connected to the first level shifting element and to a source of negative bias potential to lower the level of the OR output. The gate of an output FET is connected to the OR output, with the source connected to ground and the drain providing a logic output from the circuit.

In a more particular embodiment, the logic circuit includes a plurality of AND logic elements, each including a plurality of Schottky diodes, with the cathode of each diode connected to a logic input and the anodes connected in common to establish an AND output. Each AND output is provided with a diode pull up FET, the source being connected to the AND output, the gate connected to the source, and the drain connected to a source of positive bias potential. An OR logic element includes a plurality of Schottky diodes with each anode connected to one of the AND outputs and the cathodes connected in common to establish an OR output. A diode pull down FET is provided with the source connected to a source of negative bias potential, the gate connected to the source, and the drain connected to the OR output. A level shifting diode is connected between the OR output and the drain of the diode pull down FET, while the drain of an output FET provides a logic output from the circuit, with the source connected to ground and the gate connected to the drain of the diode pull down FET. An output pull up FET is included with the source connected to the drain of the output FET, the gate connected to the source, and the drain connected to the source of positive bias potential.

The circuit of this invention may also include a driver stage, with a source follower driver FET having the gate connected to the OR output and the drain connected to the source of positive bias potential. A source follower pull down FET is provided with the source connected to the source of negative bias potential, the gate connected to the source, and the drain connected to the source of the source follower driver FET. In this embodiment, a level shifting element may be placed between the OR output and the gate of the source follower driver FET, between the source of the source follower driver FET and the gate of the output FET, or the level shifting element may be divided and level shifting elements provided in both of the above positions in the circuit.

In the preferred embodiment, the FETs in the circuit are depletion mode GaAs Schottky barrier FETs and the diodes are GaAs Schottky barrier diodes.

These examples summarize some of the more important features of this invention, in order to facilitate an understanding of the detailed description which follows and so that the contributions which this invention provides to the art may be better appreciated. There are, of course, additional features of the invention, which will be further described below and which are included within the subject matter of the appended claims.

BRIEF DESCRIPTION OF THE DRAWINGS

Additional objectives, features, and advantages of the present invention will be evident from the description below of the preferred embodiments and the accompanying drawings, wherein the same numerals are used to refer to like elements throughout all the figures. In the drawings.

DESCRIPTION OF THE PREFERRED EMBODIMENTS

This invention involves solid state logic circuitry which is designed to facilitate the production of large scale (LSI) and very large scale (VLSI) integrated circuitry. Although the particular embodiments discussed here were developed for implementation in gallium arsenide materials, those skilled in the art will recognize that other materials as well may be utilized in practicing this invention. Furthermore, while the discussion herein focusses upon the realization of this invention in positive logic, the invention may also be used in embodiments employing negative logic.

Figure 1:
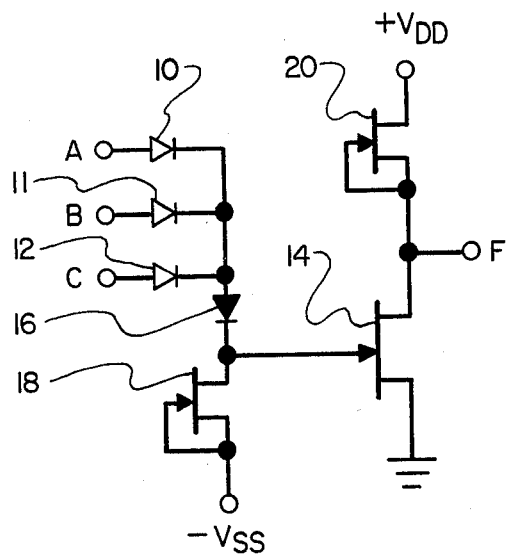
FIG. 1 is a schematic drawing illustrating a positive NOR gate Schottky diode FET logic circuit.

FIG. 1 is a circuit diagram illustrating a three input Schottky diode field effect transistor logic (SDFL) positive NOR gate which utilizes current sourcing logic, as disclosed in U.S. Patent Application Ser. No. 011,266, filed Feb. 12, 1979. In this gate, an OR logic element is provided in the form of very small, high conductance, ultra low capacitance Schottky diodes 10, 11, and 12. The anodes of the diodes are connected to logic inputs A, B, and C, while the cathodes of the diodes are connected in common to establish an OR output. The OR output is applied to the gate of a low power, high transconductance depletion mode GaAs metal semiconductor field effect transistor (MESFET) 14. The FET 14 inverts the OR output and provides gain, so that the logic output of the circuit, which is obtained from the drain of the MESFET 14, is $F = \overline{A + B + C}$. In addition to their logic function, the diodes 10, 11, and 12 provide approximately 0.8 volt of level shifting between the positive incoming logic levels and the negative gate voltages required by the normally-on, depletion mode FET 14. Where an FET with a very low (approximately −0.5 V) pinchoff voltage is used, the diodes provide adequate level shifting of themselves. By adding a level shifting diode 16 between the OR output and the gate of the FET 14, FETs with slightly higher pinchoffs may be used with higher supply voltages and logic swings. A pull down FET 18, with its gate shorted to its source, is connected to a negative voltage source $-V_{ss}$ to sink the bias current for the diodes and provide most of the turn off current for the output FET 14. A pull up FET 20, with its gate shorted to its source, is coupled to a source of positive voltage $+V_{DD}$ to maintain the proper voltage level at the logic output F.

The logical OR diodes 10, 11, and 12 require a deep (approximately 0.5 μm) low sheet resistance implant for their fabrication, whereas the MESFETs 14, 18, and 20 require a very shallow (0.1–0.2 μm), higher sheet resistance implant. As a consequence, SDFL circuits cannot be fabricated by conventional mesa-epitaxial or mesa-uniform implant fabrication techniques. Instead, two individual, localized implants into a semi-insulating substrate have been utilized to produce this circuitry in GaAs.

Although the SDFL logic of FIG. 1 can be extended to two level OR/NAND functions by the use of multigate FETs or to three level OR/NAND/WIRED-AND logic with drain dotting (wiring NAND-gate FETs together with a common drain pull up) the number of ANDed terms which can practically be added to the circuit is limited. It is thus an outstanding feature of the present invention to provide a logic circuit which avoids this fan-in dependence of switching speed by utilizing Schottky barrier diodes for an additional level of logic.

Figure 2:
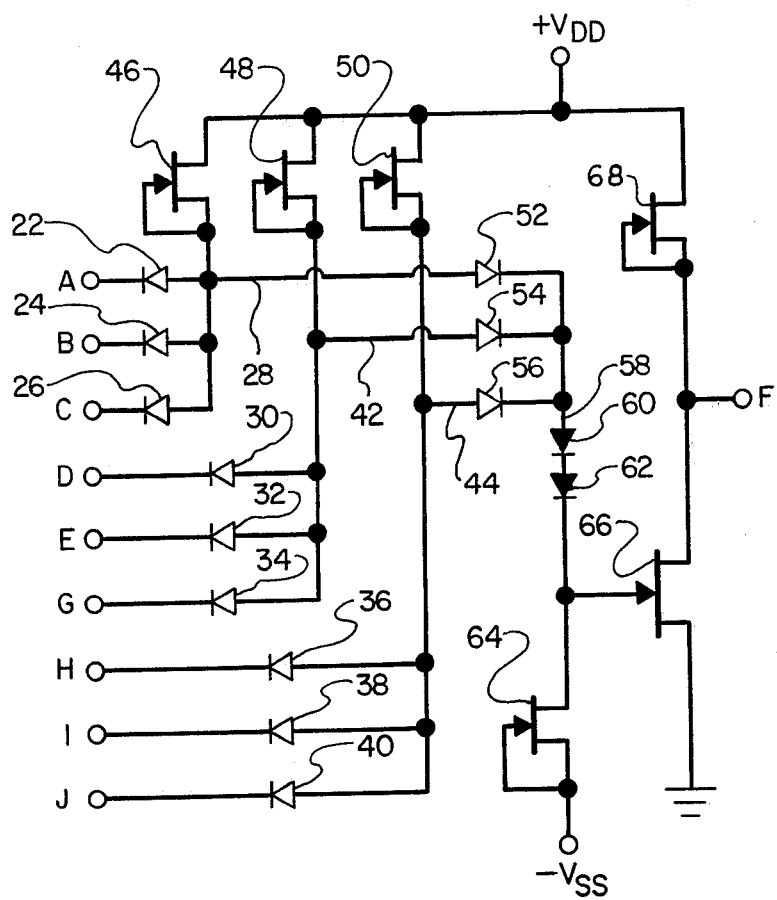
FIG. 2 is a schematic diagram illustrating the Schottky diode-diode FET logic circuit of the present invention in a positive AND/NOR gate configuration.

FIG. 2 is a schematic diagram illustrating a Schottky diode-diode field effect transistor logic (SD²FL) circuit constructed according to the present invention. In the embodiment illustrated, three AND logic elements are provided, with the first AND element including three high conductance Schottky barrier switching diodes 22, 24, and 26. The cathode of each diode is connected to a different one of the logic inputs A, B, and C, while the anodes are connected in common to establish a first AND output on a line 28. In a similar manner, a second AND logic element includes three Schottky diodes 30, 32, and 34 connected to the logic inputs D, E, and G, and a third AND logic element includes three Schottky diodes 36, 38, and 40 connected to the logic inputs H, I, and J. The common anodes of the diodes 30, 32, and 34 establish a second AND output on a line 42, while the common anodes of the diodes 36, 38, and 40 establish a third AND output on a line 44.

A first diode pull up FET 46 is connected to the line 28 to raise the level of the first AND output. The FET 46 has its gate shorted to its source, with the source connected to line 28 and the drain connected to a source of positive bias potential $+V_{DD}$. Similarly, second and third diode pull up FETs 48 and 50 are provided to raise the levels of the second and third AND outputs. A number of devices, such as depletion mode loads, shorted-gate depletion mode MESFETS, short-channel velocity saturation current limiters, or other constant current devices, can function as the diode pull ups. Resistors could be used, but are not preferred.

An OR logic element is formed in the circuit by three Schottky diodes 52, 54, and 56, with the anode of the diode 52 connected to the first AND output through the line 28, the anode of the diode 54 connected to the second AND output through the line 42, and the anode of the diode 56 connected to the third AND output through the line 44. The cathodes of the diodes 52, 54, and 56 are connected in common to establish an OR output on a line 58.

A level shifting element in the form of first and second level shifting diodes 60 and 62 is provided in the line 58 to reduce the voltage level of the OR output. These diodes are high conductance GaAs Schottky barrier diodes with a larger area than the logic diodes. A diode pull down FET 64 is utilized to further reduce the level of the OR output. The gate of the FET 64 is shorted to the source, which in turn is connected to a source of negative bias potential $-V_{ss}$, while the drain is connected to the cathode of the second level shifting diode 62. The pull down function may also be accomplished by any of the devices mentioned above with respect to the diode pull ups.

The logic signal is inverted and amplified by an output FET 66, the gate of which is connected to the drain of the pull down FET 64. The output FET is a low power depletion mode, or enhancement-depletion mode, MESFET. The source of the FET 66 is grounded, while the drain, which provides the logic output F for the circuit, is connected to a shorted gate output pull up FET 68, which helps to raise the level of the output. The drain of the output FET 66 is connected to the source of the pull up FET 68, while the drain of the pull up FET is connected to the source of positive bias potential $+V_{DD}$. In the configuration of FIG. 2, the SD²FL logic provides an AND/NOR logic function, i.e., for the inputs shown the output is $F=\overline{(A \cdot B \cdot C)+(D \cdot E \cdot G)+(H \cdot I \cdot J)}$. The pull up function may also be accomplished by any of the devices mentioned above with respect to the diode pullups.

Figure 3:
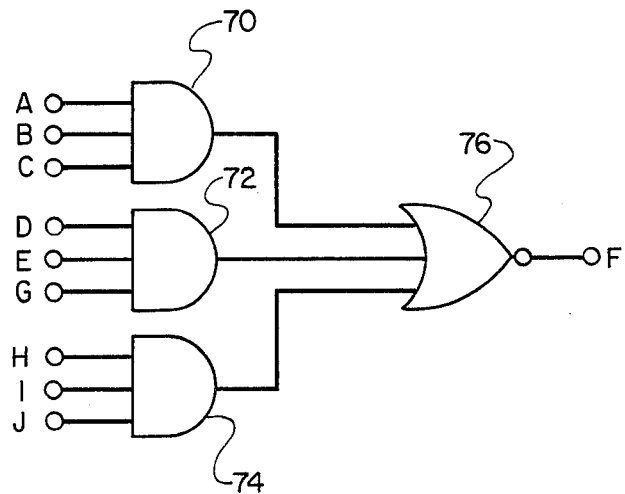
FIG. 3 is a logic symbol diagram illustrating the positive logic function performed by the circuitry of FIG. 2.

FIG. 3 illustrates the logical function performed by the circuitry of FIG. 2 in a logic symbol diagram, with the AND gates 70, 72, and 74 corresponding to the groups of diodes 22, 24, and 26; 30, 32, and 34; and 36, 38, and 40, respectively. The NOR gate 76 corresponds to the group of diodes 52, 54, and 56 and, for inversion, to the output FET 66 of FIG. 2.

Figure 4:
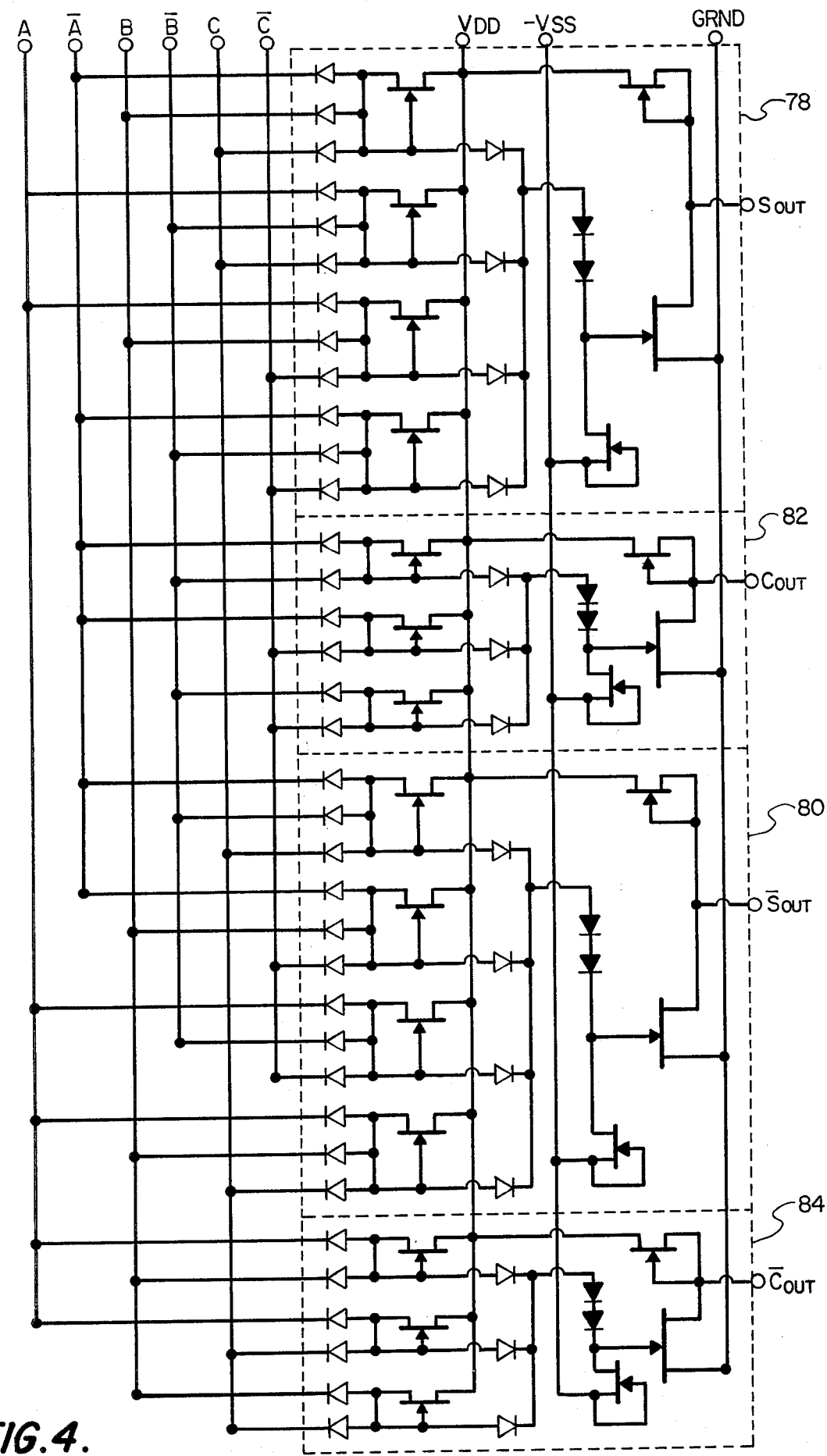
FIG. 4 is a schematic diagram of a full adder incorporating the logic circuitry of FIG. 2.

FIG. 4 is a schematic diagram illustrating how the two level diode logic of FIG. 2 might be utilized in a typical application to construct a full adder for three logic inputs A, B, and C, and their complements. In the adder, the SD²FL circuit of FIG. 2 is incorporated to produce each of the four outputs which are required. To obtain the sum output, for example, an SD²FL circuit 78 with 12 inputs is used to provide the logic output $S_{OUT}=\overline{(\overline{A} \cdot \overline{B} \cdot C)+(\overline{A} \cdot \overline{B} \cdot \overline{C})+(A \cdot \overline{B} \cdot \overline{C})+(\overline{A} \cdot \overline{B} \cdot \overline{C})}$. In a similar fashion, an SD²FL circuit 80 provides the sum complement output $\overline{S}_{OUT}=\overline{(\overline{A} \cdot \overline{B} \cdot C)+(\overline{A} \cdot B \cdot \overline{C})+(A \cdot \overline{B} \cdot \overline{C})+(A \cdot B \cdot C)}$. SD²FL circuits 82 and 84 with six inputs each provide the carry $C_{OUT}=\overline{(\overline{A} \cdot \overline{B})+(\overline{A} \cdot \overline{C})+(\overline{B} \cdot \overline{C})}$ and complementary carry $\overline{C}_{OUT}=\overline{(A \cdot B)+(B \cdot C)+(A \cdot C)}$ outputs. The adder of FIG. 4, which might find practical application, for example, in an array multiplier cell, illustrates how, with two levels of logic having essentially unlimited width (as opposed to a FET NAND, which is typically limited to two or three terms), most desired logic functions can be directly obtained from their full min-term (sum of products) expansion with only one gate delay from the inputs and input complements. This configuration is faster, with only a single gate delay, than a NOR-implemented full max-term (product of sums) expansion of a single sum and carry output full adder, which requires three gate delays to obtain the sum output and two gate delays to obtain the carry output. Moreover, the configuration of the present invention is simpler, requiring only four gates for a complementary full adder as opposed to twelve gates for such a NOR-implemented adder.

Where circuitry such as the adder of FIG. 4 is implemented with the particular SD$^2$FL circuit shown in FIG. 2, however, the potential speed advantage of the SD$^2$FL logic may not be realized because of the unfavorable ratio which will exist between the width of the diode pull down FET 64 and the width required of the output FET 66 to handle all of the diode pull up currents which it must sink. In the adder of FIG. 4, for example, a typical width for the diode pull down FETs (i.e., FET 64 in FIG. 2) would be 1 $\mu$m. To obtain equal positive and negative slewing currents, the diode pull up FETs (i.e., FETs 46, 48, and 50 in FIG. 2) would be 2 $\mu$m. There are six pull up FETs in the adder for each input (a fan out of 6) for a total width of 12 $\mu$m. Depending upon the number of overcrossings and other parasitic capacitances in a particular implementation of the circuit, the output pull up FET (i.e., FET 68 in FIG. 2) might require a width of approximately 4 $\mu$m to drive line parasitics, resulting in a total pull up width of 16 $\mu$m. The output FET width (i.e., the width of the FET 66 in FIG. 2) would then generally need to be about 20 $\mu$m, for an output FET width to pull down FET width ratio of 20 to 1. For the highest speed operation, however, this ratio should normally be held to no more than approximately 5 to 1.

Figure 5:
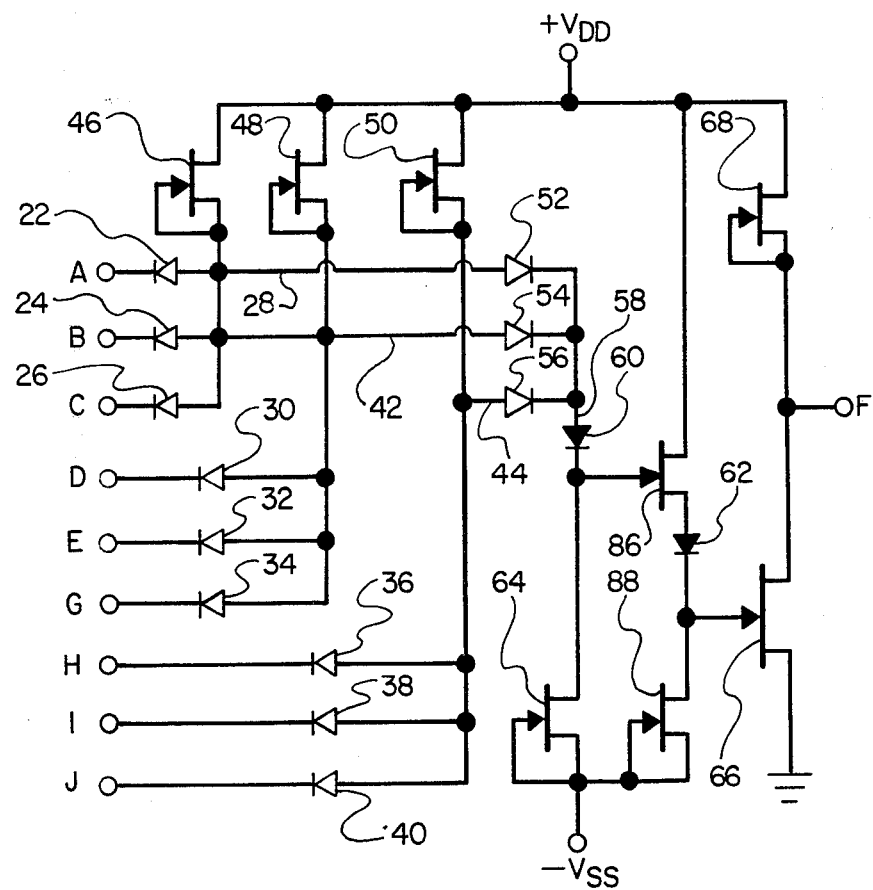
FIG. 5 is a schematic diagram illustrating another embodiment of the Schottky diode-diode FET logic of the present invention.

FIG. 5 is a circuit schematic illustrating another embodiment of the two-level (AND/NOR) SD$^2$FL logic of this invention which can be used to implement complex logic circuits, such as the adder of FIG. 4, without a loss of speed due to fan out drive problems arising from an excessive output to pull down FET width ratio. The circuit of FIG. 5 will increase the complexity and power consumption of the logic only minimally. The AND and OR groups of Schottky diodes 22, 24, 26, 30, 32, 34, 36, 38, 40, 52, 54, and 56, the diode pull up FETs 46, 48, and 50, the level shifting diodes 60 and 62, the diode pull down FET 64, the output FET 66, and the output pull up FET 68 all operate in the same manner described with respect to the embodiment illustrated in FIG. 2.

In addition to positioning the level shifting diodes 60 and 62 in the circuit as shown in FIG. 5, it is also possible to place all of the level shifting element at the location of the diode 60 or to place all of the level shifting element at the location of the diode 62. The embodiment of FIG. 5 includes in addition, however, a buffer stage consisting of a source follower drive FET 86 and a source follower pull down FET 88. The source of the source follower driver 86 and the drain of the source follower pull down 88 are connected through the second level shifting diode and are applied to the gate of the output FET 66. The source, and the shorted gate, of the pull down 88 are connected to the source of negative bias potential $-V_{SS}$, while the drain of the driver 86 is applied to the source of positive bias potential $+V_{DD}$. The logic signal is coupled through the gate of the source follower driver which is connected to the cathode of the first level shifting diode 60.

This source follower driver stage provides a current gain from the small current levels provided by the logic diodes up to the substantial drive currents required for the output FET 66, the output FET necessarily being relatively large in order to handle large fan out loadings. The width of the source follower driver 86 and its pull down 88 may be approximately 25% to 35% of the width of the output FET and provide more than adequate levels of drive current to the gate of the output FET 66 for very high switching speeds, while the input capacitance at the gate of the source follower will nevertheless be very low, both because the width of the FET 86 is fairly small and because the FET is connected in a source follower configuration which effectively reduces its input capacitance. As a result, even though the diode pull down FET 64 is small (an effective width of approximately 1 $\mu$m achieved either directly with a length of 1 $\mu$m and a width of 1 $\mu$m shorted gate FET, or with a wider and longer gate FET to give the equivalent current), its current level will be adequate to obtain high negative voltage slew rates for short transition times at the source follower input. This rationale will also apply to the positive slewing current, i.e., the difference between the diode pull up FET current and the diode pull down FET current. AS a result, the gate delays for the embodiment of FIG. 5 will be only slightly longer than those for the simpler SDFL NOR gate configuration (as in FIG. 1) in a circuit capable of realizing practical logic functions with very few delays.

In conclusion, although typical embodiments of the present invention have been illustrated and discussed above, numerous modifications and alternative embodiments of the apparatus of this invention will be apparent to those skilled in the art in view of this description. Accordingly, this description is to be considered as illustrative only and is provided for the purpose of teaching those skilled in the art the manner of constructing the apparatus of this invention. Furthermore, it should be understood that the forms of the invention which are depicted and described herein are to be considered as the presently preferred embodiments. Various changes may be made in the configurations, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other features, all as will be apparent to one skilled in the art after receiving the benefit attained through reading the above description of the invention.

What is claimed is:

1. A logic circuit, comprising:
   a plurality of AND logic elements, each AND element including a plurality of Schottky diodes each having an anode and a cathode, with each cathode connected to a logic input and the anodes connected in common to establish an AND output;
   a diode pull up connected to each AND output and to a source of positive bias potential to raise the level of said AND output;
   an OR logic element, including a plurality of Schottky diodes each having an anode and a cathode, with each anode connected to one of said AND outputs and the cathodes connected in common to establish an OR output;

a first level shifting element connected to said OR output;

a diode pull down connected to said OR output and to a source of negative bias potential to lower the level of said OR output; and an output field effect transistor having a source, a gate, and a drain, with the gate connected to said first level shifting element, the source connected to ground, and the drain providing a logic output from said circuit.

2. The circuit of claim 1, wherein said first level shifting element further comprises a level shifting diode.

3. The circuit of claim 2, wherein said Schottky diodes and said level shifting diode further comprise GaAs diodes.

4. The circuit of claim 1, further comprising an output pull up connected to said logic output and said source of positive bias potential to raise the level of said logic output.

5. The circuit of claim 4, wherein:

said output pull up further comprises an output pull up field effect transistor having a source, a gate, and a drain, with the source connected to the drain of said output field effect transistor, the gate connected to the source, and the drain connected to said source of positive bias potential;

each of said diode pull ups further comprises a diode pull up field effect transistor having a source, a gate, and a drain, with the source connected to said AND output, the gate connected to the source, and the drain connected to said source of positive bias potential; and said diode pull down further comprises a diode pull down field effect transistor having a source, a gate, and a drain, with the source connected to said source of negative bias potential, the gate connected to the source, and the drain connected to the gate of said output field effect transistor.

6. The circuit of claim 5, wherein said output pull up, said diode pull ups, and said diode pull down each further comprises a depletion mode GaAs field effect transistor.

7. The circuit of claim 6, wherein said output pull up, said diode pull ups, and said diode pull down each further comprises a depletion mode GaAs Schottky barrier field effect transistor.

8. The circuit of claim 1, further comprising a driver stage, including:

a source follower driver connected between said source of positive bias potential and the gate of said output field effect transistor for receiving said OR output; and a source follower pull down connected between the gate of said output field effect transistor and said source of negative bias potential.

9. The circuit of claim 8, wherein:

said source follower driver further comprises a source follower driver field effect transistor having a source, a gate, and a drain, with the source connected to the gate of said output field effect transistor, the gate connected to said OR output, and the drain connected to said source of positive bias potential; and said source follower pull down further comprises a source follower pull down field effect transistor having a source, a gate, and a drain, with the source connected to said source of negative bias potential, the gate connected to the source, and the drain connected to the gate of said output field effect transistor.

10. The circuit of claim 9, wherein said source follower driver and said source follower pull down each further comprises a depletion mode GaAs field effect transistor.

11. The circuit of claim 10, wherein said source follower driver and said source follower pull down each further comprises a depletion mode GaAs Schottky barrier field effect transistor.

12. The circuit of claim 9, wherein said first level shifting element is connected between said OR output and the gate of said source follower driver field effect transistor; and further comprising a second level shifting element connected between the source of said source follower driver field effect transistor and the gate of said output field effect transistor.

13. The circuit of claim 12, wherein said first and second level shifting elements each further comprises a level shifting diode.

14. The circuit of claim 13, wherein said level shifting diodes and said Schottky diodes further comprise GaAs diodes.

15. A logic circuit, comprising:

a plurality of AND logic elements, each AND element including a plurality of Schottky diodes each having an anode and a cathode, with each cathode connected to a logic input and the anodes connected in common to establish an AND output;

a diode pull up field effect transistor, having a source, a gate, and a drain, for each AND output, with the source connected to said AND output, the gate connected to the source, and the drain connected to a source of positive bias potential;

an OR logic element, including a plurality of Schottky diodes each having an anode and a cathode, with each anode connected to one of said AND outputs and the cathodes connected in common to establish an OR output;

a diode pull down field effect transistor, having a source, a gate, and a drain, with the source connected to a source of negative bias potential, the gate connected to the source, and the drain connected to said OR output;

a level shifting diode connected between said OR output and the drain of said diode pull down field effect transistor;

an output field effect transistor having a source, a gate, and a drain, with the gate connected to the drain of said diode pull down field effect transistor, the source connected to ground, and the drain providing a logic output from said circuit; and an output pull up field effect transistor having a source, a gate, and a drain, with the source connected to the drain of said output field effect transistor, the gate connected to the source, and the drain connected to said source of positive bias potential.

16. A logic circuit, comprising:

a plurality of AND logic elements, each AND element including a plurality of Schottky diodes each having an anode and a cathode, with each cathode connected to a logic input and the anodes connected in common to establish an AND output;

a diode pull up field effect transistor, having a source, a gate, and a drain, for each AND output, with the source connected to said AND output, the gate connected to the source, and the drain connected to a source of positive bias potential;

an OR logic element, including a plurality of Schottky diodes each having an anode and a cathode, with each anode connected to one of said AND outputs and the cathodes connected in common to establish an OR output;

a first level shifting diode connected to said OR output;

a diode pull down field effect transistor, having a source, a gate, and a drain, with the source connected to a source of negative bias potential, the gate connected to the source, and the drain connected to said first level shifting diode;

a source follower driver field effect transistor having a source, a gate, and a drain, with the gate connected to said OR output through said first level shifting diode and the drain connected to said source of negative bias potential;

a second level shifting diode connected to the source of said source follower driver field effect transistor;

a source follower pull down field effect transistor having a source, a gate, and a drain, with the source connected to said source of negative bias potential, the gate connected to the source, and the drain connected to the source of said source follower driver field effect transistor through said second level shifting diode;

an output field effect transistor having a source, a gate, and a drain, with the source connected to ground, the gate connected to the drain of said source follower pull down field effect transistor, and the drain providing a logic output from said circuit; and an output pull up field effect transistor having a source, a gate, and a drain, with the source connected to the drain of said output field effect transistor, the gate connected to the source, and the drain connected to said source of positive bias potential.

* * * * *